United States Patent
Hong et al.

(10) Patent No.: US 10,068,988 B2
(45) Date of Patent: Sep. 4, 2018

(54) DOPED POLY-SILICON FOR POLYCMP PLANARITY IMPROVEMENT

(71) Applicant: Taiwan Semiconductor Manufacturing Company, Ltd., Hsinchu (TW)

(72) Inventors: William Weilun Hong, Hsinchu (TW); Po-Chin Nien, Taipei (TW); Ying-Tsung Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/860,308

(22) Filed: Jan. 2, 2018

(65) Prior Publication Data

US 2018/0145152 A1    May 24, 2018

Related U.S. Application Data

(62) Division of application No. 15/200,966, filed on Jul. 1, 2016, now Pat. No. 9,871,115.

(51) Int. Cl.
| | |
|---|---|
| *H01L 21/8234* | (2006.01) |
| *H01L 29/06* | (2006.01) |
| *H01L 27/088* | (2006.01) |
| *H01L 27/11* | (2006.01) |
| *H01L 29/66* | (2006.01) |

(52) U.S. Cl.
CPC ........ *H01L 29/66545* (2013.01); *H01L 21/823431* (2013.01); *H01L 21/823437* (2013.01); *H01L 21/823481* (2013.01); *H01L 27/0886* (2013.01); *H01L 27/1104* (2013.01); *H01L 27/1116* (2013.01); *H01L 29/0653* (2013.01)

(58) Field of Classification Search
USPC .......................................... 438/595
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,214,358 B1* | 12/2015 | Lin | H01L 29/66 |
| 9,412,666 B2* | 8/2016 | Chen | H01L 29/66 |
| 9,871,115 B1* | 1/2018 | Hong | H01L 29/66545 |

(Continued)

*Primary Examiner* — Marcos D Pizarro
*Assistant Examiner* — Lawrence Tynes, Jr.
(74) *Attorney, Agent, or Firm* — Slater Matsil, LLP

(57) ABSTRACT

A method includes forming a polysilicon layer with an uneven upper surface over a first region and a second region of a substrate, doping a top portion of the polysilicon layer to change its removal rate, thereby forming a doped layer, and removing the doped layer in the first region to expose the polysilicon layer in the first region and leaving at least a portion of the doped layer in the second region. The method also includes removing the exposed polysilicon layer in the first region at a first removal rate and the doped layer in the second region at a second removal rate, the polysilicon layer in the second region being exposed after the doped layer in the second region is removed, and removing the polysilicon layer in the first region and the second region at a third removal rate and a fourth removal rate, respectively.

20 Claims, 9 Drawing Sheets

(56) References Cited

U.S. PATENT DOCUMENTS

| | | | |
|---|---|---|---|
| 2004/0152331 A1* | 8/2004 | Xu | H01J 37/321 438/719 |
| 2009/0166629 A1* | 7/2009 | Mehrad | H01L 21/82384 257/57 |
| 2014/0206164 A1* | 7/2014 | Lin | H01L 29/66795 438/270 |
| 2014/0282326 A1 | 9/2014 | Chen et al. | |
| 2016/0126142 A1* | 5/2016 | Chen | H01L 29/66 438/283 |
| 2018/0006134 A1* | 1/2018 | Hong | H01L 29/66545 |

\* cited by examiner

DOPED POLY-SILICON FOR POLYCMP PLANARITY IMPROVEMENT

PRIORITY CLAIM AND CROSS-REFERENCE

This patent application is a divisional of U.S. patent application Ser. No. 15/200,966, filed Jul. 1, 2016 and entitled "Doped Poly-Silicon for PolyCMP Planarity Improvement," which application is hereby incorporated by reference herein as if reproduced in its entirety.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
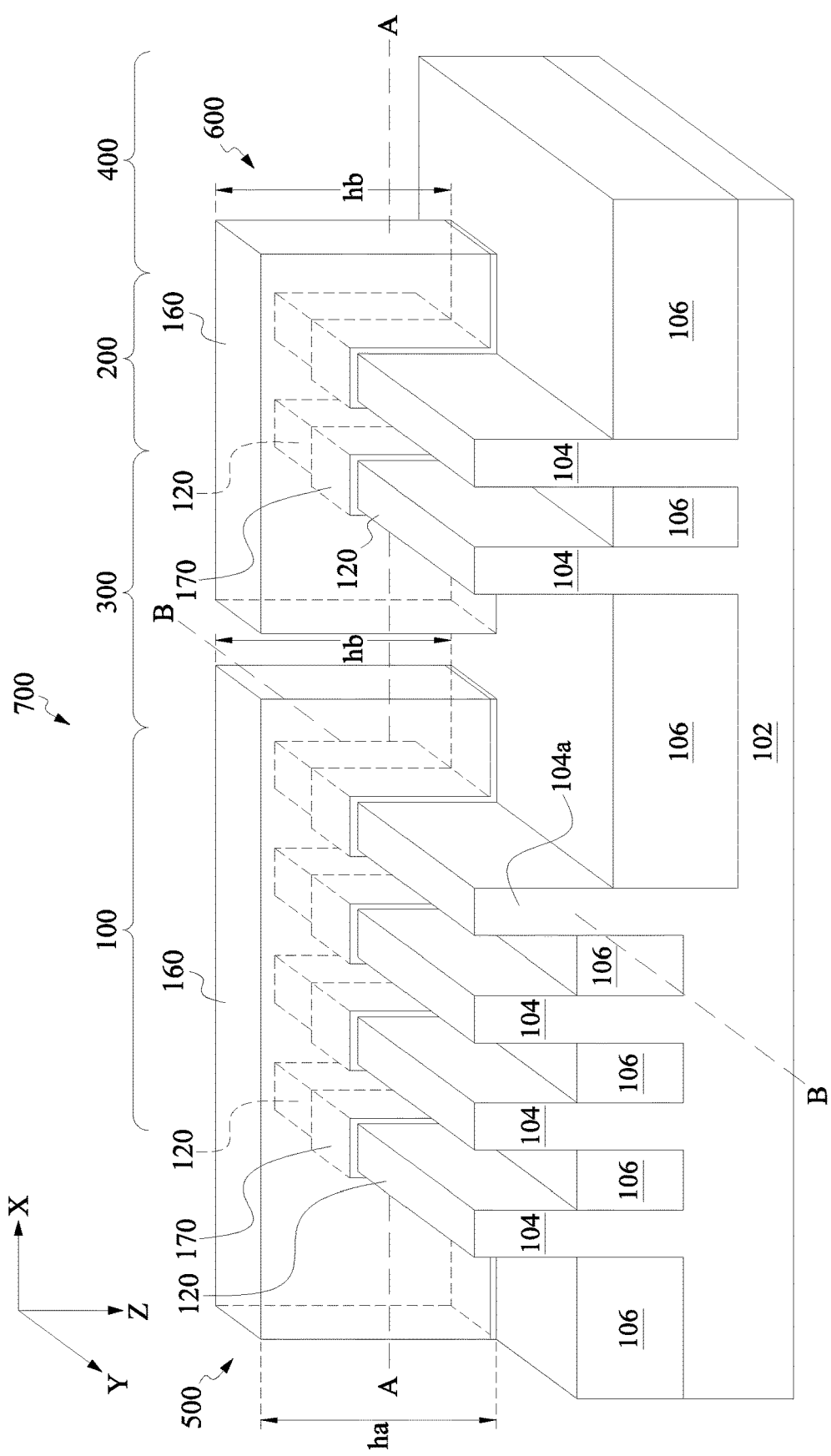
FIG. 1 illustrates a perspective view of an embodiment of a semiconductor device according to one or more aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor ICs include devices such as transistors, capacitors, resistors, and inductors that are formed in or on the substrate of an IC using lithography and patterning techniques. These semiconductor devices are inter-connected according to the design of the IC to implement different functions. In a typical IC, the silicon area is divided into many regions for different functions. Due to the nature of different designs entailed by the different functions, some functional regions have a higher pattern density than other regions. For example, a region of the IC used for static random access memory (SRAM) may have a higher pattern density than a region for a logic function. The difference in pattern density may cause an undesirable "loading effect." For example, a polysilicon layer formed on the substrate may be thicker in regions with high pattern density than regions with low pattern density. The unevenness, or topography, of the polysilicon layer may adversely affect the IC manufacturing process.

For illustration purposes, the present disclosure is described using a Fin Field-Effect Transistor (FinFET) device as an example. However, methods disclosed in the present disclosure are generic and are not limited to FinFET devices. One skilled in the art will appreciate from the descriptions below that methods in the present disclosure are applicable to planar devices as well. The use of FinFET device in the discussion below should not limit the scope of the current disclosure. In addition, processing steps described hereafter are for illustration purpose only and should not unduly limit the scope of the current disclosure. It is to be understood that the described processing steps may be modified, the order of processing steps may be altered, some processing steps may be deleted, and more processing steps may be added. These and other modifications are fully intended to be included in the scope of the current disclosure.

Illustrated in FIG. 1 is a perspective view of a semiconductor device 700 in accordance with some embodiments of the present disclosure. The semiconductor device 700 includes a first region 100, a second region 200, a third region 300 and a forth region 400. Regions 100 and 200 may correspond to regions of semiconductor device 700 that have high pattern densities, while regions 300 and 400 may correspond to regions of semiconductor device 700 that have lower pattern densities. Two FinFET devices 500 and 600 are illustrated in FIG. 1. Each of FinFET devices 500 and 600 may be an n-type FinFET device or a p-type FinFET device. Semiconductor device 700 may be included in an IC such as a microprocessor, memory device, and/or other IC. As illustrated in FIG. 1, semiconductor device 700 includes a substrate 102, a plurality of fins 104, a plurality of isolation structures 106, and gate structures 160 disposed on fins 104 of semiconductor devices 500 and 600. Each of fins 104 includes a source/drain region denoted 120 where a source or drain feature is formed in, on, and/or surrounding fin 104. A channel region of fin 104 underlies gate structure 160 and is denoted as 170.

In accordance with some embodiments, region 100 has a higher pattern density than region 200. Region 100 might correspond to a SRAM region in the IC, and region 200 might correspond to a logic region, a peripheral region, a standard-cell region, or other region with lower pattern density in the IC than region 100. Regions 300 and 400 may correspond to regions without a fin structure, thus having even lower pattern densities than region 200, for example. In addition, fins 104 in region 100 may have a height different from that of fins 104 in region 200, possibly due to different amount of etching when forming fins 104 in different regions. Despite the different fin heights, the top surfaces 104T of all fins 104 (see FIG. 2), in both regions 100 and 200, are coplanar in accordance with an embodiment of the present disclosure. The different heights for fins 104 mean that an upper surface 102a (see FIG. 2) of substrate 102 in region 100 is not coplanar with an upper surface 102b (see FIG. 2) of substrate 102 in region 200. In the example shown in FIG. 1, the boundary between the two different upper surfaces of substrate 102 falls on the right edge of the rightmost fin (denoted as fin 104a) of FinFET device 500. As a result of the different top surfaces of substrate 102, an upper surface 106a (see FIG. 2) of isolation structure 106 in region 100 may not be coplanar with an upper surface 106b (see FIG. 2) of isolation structure 106 in region 200, in accordance with some embodiments. As illustrated in FIG. 1, since gate structures 160 extend from an upper surface of isolation structures 106 upwards, the uneven upper surface of isolation structures 106 results in a first height $h_a$ and a second height $h_b$ for a left sidewall and a right sidewall of gate structure 160 of FinFET device 500, respectively. The gate structure 160 of device 600 has a height $h_b$ for both the left and the right sidewalls, as illustrated in FIG. 1. Despite the different gate structure 160 sidewall heights, the top surfaces of gate structures 160 of FinFET devices 500 and 600 are coplanar, in accordance with an embodiment of the present disclosure. As a result, gate height, defined as the distance from the top surface 104T of fins 104 to the top surface of gate structures 160 (refer to $h_2$ in FIG. 9), are equal in all regions of the IC chips, regardless of pattern densities, in accordance with some embodiments.

In accordance with some embodiments, semiconductor device 700 is provided during fabrication and gate structure 160 is a sacrificial gate structure such as formed in a replacement gate process used to form a metal gate structure. In an embodiment, gate structure 160 includes polysilicon. In another embodiment, gate structure 160 includes a metal gate structure.

Semiconductor device 700 may include other layers and/or features not specifically illustrated including additional source/drain regions, interlayer dielectric (ILD) layers, contacts, interconnects, and/or other suitable features.

As shown in FIG. 1, three directions X, Y and Z are defined. A direction X is parallel to the longitudinal direction of gate structures 160. A direction Y is perpendicular to direction X, along a longitudinal direction of fins 104. A direction Z is perpendicular to both X and Y directions, along the vertical direction of gate structures 160.

Referring to FIGS. 2-13, illustrated are various views of a semiconductor device 700 at various stages of fabrication according to embodiments of the present disclosure. In FIGS. 2-13, a figure with letter "a" in its number illustrates a cross-sectional view of semiconductor device 700 in FIG. 1 at various stages of fabrication along a line A-A, where line A-A is inside gate structures 160 and parallel to direction X; and a figure with letter "b" in its number illustrates a cross-sectional view of semiconductor device 700 in FIG. 1 at various stages of fabrication along a line B-B, where line B-B is inside fin 104a of device 500 and parallel to direction Y. In addition, for FIGS. 2-13, a figure number without a letter "a" or "b" illustrates the cross-sectional view along line A-A unless otherwise stated.

Figure 2:
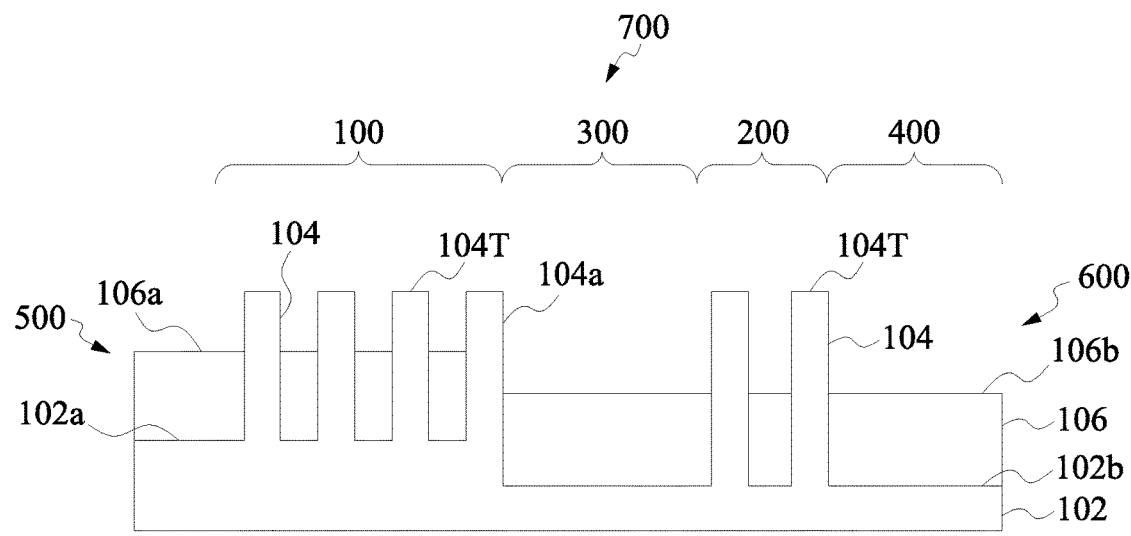
FIGS. 2-13 illustrate various cross-sectional views of a semiconductor device at various stages of fabrication in accordance with some embodiments of the present disclosure.

FIG. 2 illustrates a cross-sectional view of a FinFET semiconductor device 700 shown in FIG. 1 having a substrate 102 at one of various stages of fabrication according to embodiments of the present disclosure. As shown in FIG. 2, fins 104 are formed by, e.g., etching into substrate 102 of semiconductor device 700. Semiconductor device 700 comprises a plurality of regions, e.g., a first region 100, a second region 200, a third region 300 and a fourth region 400. Only four regions (e.g., regions 100, 200, 300 and 400) are labeled and discussed throughout the disclosure as examples, however, the number of regions in semiconductor device 700 could be more or less that shown in FIG. 2. One skilled in the art, upon reading the present disclosure, would be able to apply the methods disclosed herein to semiconductor devices with any number of regions.

As illustrated in FIG. 2, region 100 has four fins 104 and region 200 has two fins 104. Region 100 may represent a region with higher pattern density than region 200. Regions 300 and 400 of FIG. 2 do not have any fin structure, therefore, regions 300 and 400 may represent regions with pattern densities lower than region 200. Isolation structures 106 are formed between fins 104. Fins 104 extend above the isolation structures 106. It should be noted that the number of fins 104 is not limited by that shown in FIG. 2 and can be more or less than that depicted in FIG. 2. In embodiments of the present disclosure, fins 104 may be simultaneously formed, such that each fin 104 may comprise the same materials or layers.

Substrate 102 may be a silicon substrate. Alternatively, substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, substrate 102 is a semiconductor on insulator (SOI) substrate.

In some embodiments, fins 104 may be formed in substrate 102 by etching trenches in substrate 102. The etching may be any suitable etch process, such as a reactive ion etch (RIE), neutral beam etch (NBE), the like, or a combination thereof. The etching may be anisotropic. The amount of etching may be different for fins 104 of FinFET device 500 and fins 104 of FinFET device 600, such that fins 104 in region 100 and region 200 have different heights, e.g., an upper surface 102a of substrate 102 is not level with an upper surface 102b of substrate 102.

As shown in FIG. 2, an insulation material is formed between neighboring fins 104 to form isolation structure 106 (e.g., 106a and 106b). In accordance with some embodiments, isolation structure 106 forms a shallow trench isolation (STI) layer 106. The insulation material may be an oxide, such as silicon oxide, silicon nitride, silicon oxynitride, other suitable materials, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, STI layer 106 may have a multi-layer structure such as a thermal oxide liner layer filled with silicon nitride or silicon oxide. In accordance with some embodiments, STI layer 106 is formed over substrate 102 to a desired thickness and leaves upper portions of fins 104 exposed. Due to the uneven surfaces 102a and 102b of substrate 102, STI layer 106 might have uneven upper surfaces 106a and 106b as illustrated in FIG. 2. In other embodiments, STI layer 106 is formed to have a thickness larger than the heights of fins 104, such that the top surface of STI layer 106 is higher than top surfaces of fins 104. A planarization process, such as a chemical mechanical planarization (CMP) process, may be performed to planarize the top surface of STI layer 106. Next, an etching process may be performed to recess STI layer 106 to a desired thickness, so that upper portions of fins 104 are exposed. In this case, STI layer 106 might have an even upper surface (not shown) over all regions of semiconductor device 700 (e.g., regions 100, 200, 300 and 400).

Figure 3:
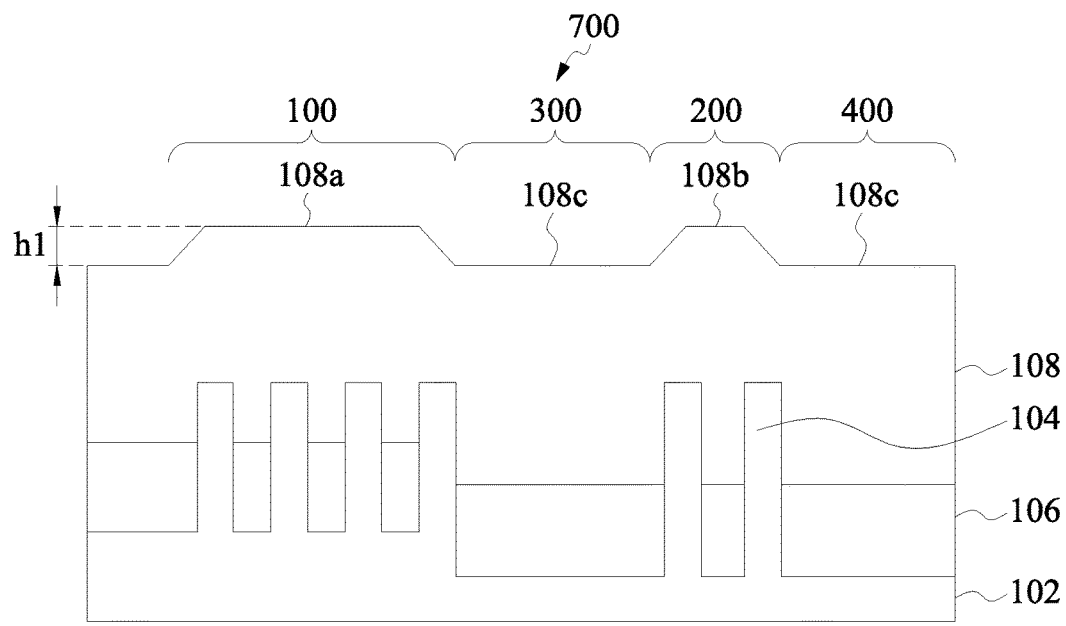

FIG. 3 illustrates a cross-sectional view of semiconductor device 700 shown in FIG. 2, after a polysilicon layer 108 is formed on top of isolation structure 106. In an embodiment of the present disclosure, polysilicon layer 108 comprises polycrystalline-silicon (poly-Si, polysilicon). Polysilicon layer 108 may be deposited by CVD, sputter deposition, furnace growth process, or other suitable techniques known and used in the art. In accordance with some embodiments, polysilicon layer 108 has a thickness between about 1000 Angstrom (Å) and about 2000 Å.

The pattern density difference between different regions of semiconductor device 700 (e.g., regions 100, 200, 300 and 400) causes a loading effect. As illustrated in FIG. 3, an upper surface 108a above fins 104 in region 100 is higher (e.g., further away from substrate 102) than an upper surface 108c in regions without fins (e.g., regions 300 and 400). For example, an offset $h_1$ between upper surfaces 108a and 108c may be between about 300 Å to about 1000 Å. Similarly, an upper surface 108b above fins 104 in region 200 may be higher than upper surface 108c in regions without fins (e.g., regions 300 and 400). Upper surface 108a is shown in FIG. 3 as being substantially coplanar with upper surface 108b. In other embodiments, upper surface 108a and 108b are not level with each other, due to, e.g., a large difference in pattern densities between regions 100 and 200.

As illustrated in FIG. 3, upper surfaces of polysilicon layer 108 exhibit a topography (e.g., uneven upper surfaces), which may cause problems for a subsequent planarization process such as a chemical mechanical planarization (CMP) process. For example, underlying pattern densities may cause polysilicon layer 108 in regions 100 and 200 to have higher (material) densities. Polysilicon layer 108 in regions 100 and 200 may also have larger surface areas (areas shown in FIG. 3 may not be drawn to scale) than polysilicon layer 108 in regions 300 and 400 due to, e.g., design requirements and/or other factors. The high (material) density, coupled with large surface areas, may cause polysilicon layer 108 in high pattern density regions (e.g., regions 100 and 200) to be removed slower than polysilicon layer 108 in low pattern density regions (e.g., regions 300 and 400). Since the removal rate of polysilicon layer 108 in high density regions are slower than the removal rate of polysilicon layer 108 in low density regions, polysilicon layer 108 may not have a planar upper surface across all regions (e.g., regions 100, 200, 300 and 400) after the CMP process. For example, after the CMP process, an offset between upper surfaces of polysilicon layer 108 in a high pattern density region and a low pattern density region may be as large as about 50 Å to about 300 Å. A doped layer 110 (see FIG. 4) is used in the current disclosure to reduce the above described problem (e.g., non-planar upper surface of polysilicon layer 108), as described below in more details.

Figure 4:
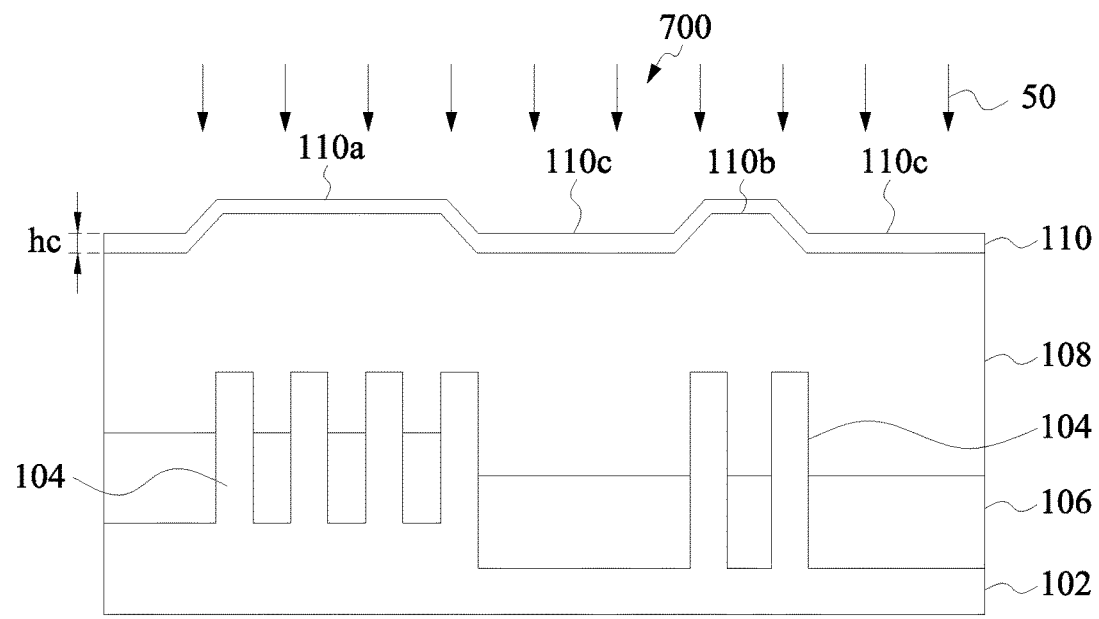

FIG. 4 illustrates a cross-sectional view of semiconductor device 700 shown in FIG. 3 after polysilicon layer 108 is treated by a process 50 to change its removal rate. Process 50 implants a doping specie, or a dopant, in a top portion of polysilicon layer 108 (e.g., the portion of polysilicon layer 108 proximate upper surfaces 108a/108b/108c) and converts the top portion of polysilicon layer 108 into a top layer 110. In some embodiments, the dopant changes the removal rate of the top portion of the polysilicon (e.g., the top layer 110 has a different removal rate than the polysilicon layer 108). The dopant may be carbon, boron, combinations thereof, or any other suitable dopant. Process 50 may be an implantation process or a plasma-doping process, although any other suitable doping process may be used. Doping the top portion of polysilicon layer 108 with, e.g., carbon and boron reduces the removal rate of the top portion of polysilicon layer 108, which advantageously alleviates the loading effect, as described in more detail hereinafter in accordance with some embodiments.

In an exemplary embodiment of the current disclosure, the formation of the top layer 110 includes implanting carbon in the top portion of polysilicon layer 108 with a doping concentration, or dosage, from about $1E14/cm^2$ to about $1E17/cm^2$. A doping energy of about 1 Kev may be used for the implantation of carbon. In another embodiment, the formation of the top layer 110 includes implanting boron in the top portion of polysilicon layer 108 with a dosage between about $1E14/cm^2$ to about $1E15/cm^2$. A doping energy between about 0.5 Kev to about 100 Kev, e.g., about 1 Kev, may be used for the implantation of boron. Ion implantation devices, such as devices manufactured by Varian Company, Palo Alto, Calif., and Applied Materials, Inc. may be used.

Figure 14:
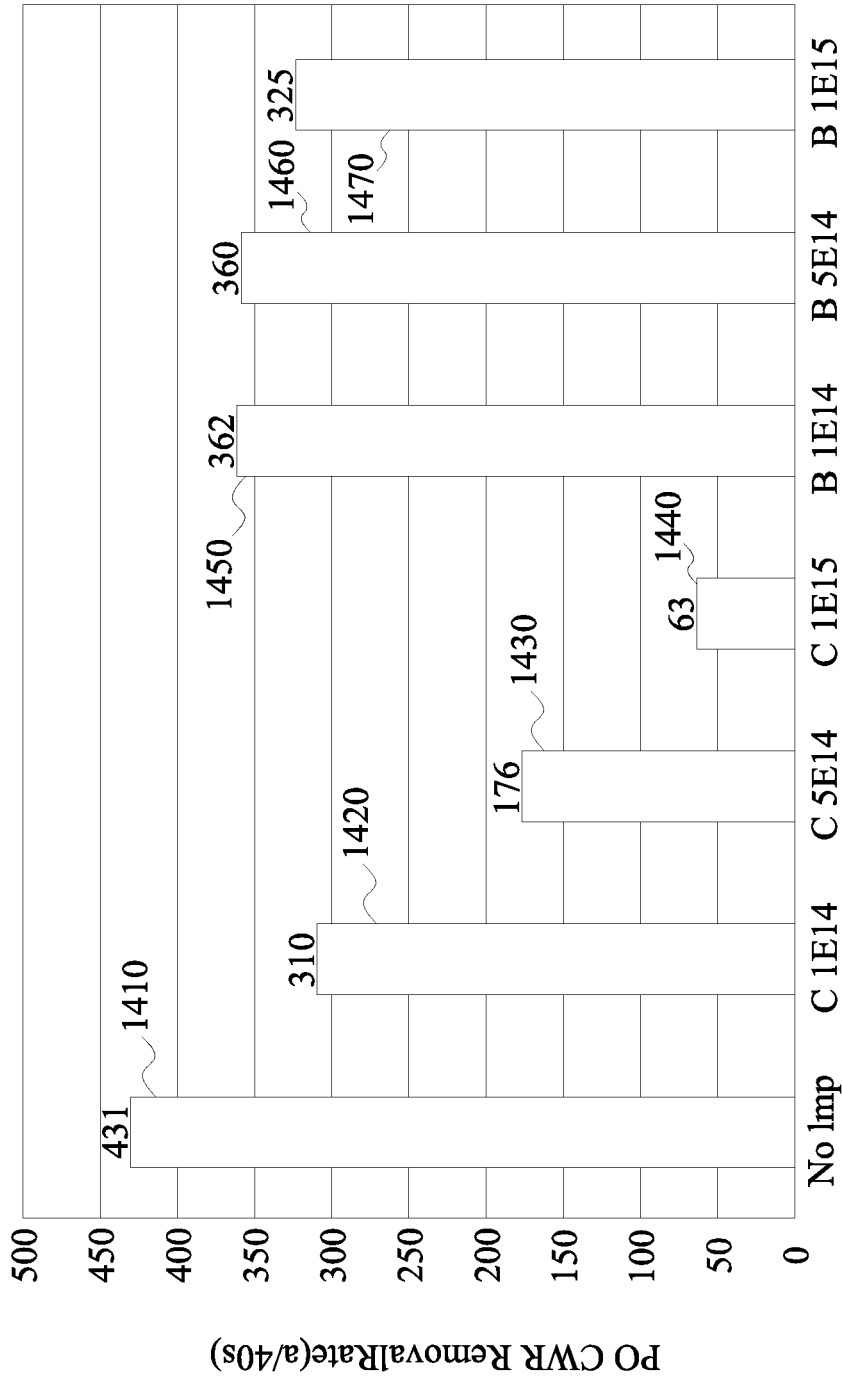
FIG. 14 illustrates the polysilicon removal rate for different implant species and concentrations in accordance with some embodiments of the present disclosure.

Referring temporarily to FIG. 14, the bar graph of FIG. 14 illustrates the measured removal rate of polysilicon for different dopants at different dosages. For the measurements shown in FIG. 14, polysilicon control wafers (e.g., blank polysilicon wafers) are doped with different dopants at different dosages, and a CMP process is performed on the polysilicon control wafers to measure the removal rates for different combinations of dopant and dosage, which removal rate are characterized by the reduction in the thickness of polysilicon control wafers in 40 seconds. For comparison purpose, a blank polysilicon wafer without doping is used to measurement the removal rate of un-doped polysilicon, which is shown as bar 1410 in FIG. 14. Bars 1420, 1430 and 1440 show the removal rates of polysilicon control wafers doped with carbon at a dosage of $1E14/cm^2$, $5E14/cm^2$ and $1E15/cm^2$, respectively. Similarly, bars 1450, 1460 and 1470 show the removal rates for polysilicon control wafers doped with boron at a dosage of $1E14/cm^2$, $5E14/cm^2$ and $1E15/cm^2$, respectively.

As illustrated in FIG. 14, the un-doped polysilicon control wafer has a removal rate of about 431 Å per 40 seconds. Both carbon and boron reduce the removal rate of the polysilicon control wafer, and the removal rate of the polysilicon control wafer is further reduced as the concentration of dopant increases. For example, as the doping concentration of carbon increases from about $1E14/cm^2$ to about $1E15/cm^2$, the removal rate decreases from about 310 Å per 40 seconds to about 63 Å per 40 seconds. Compared with the removal rate for un-doped polysilicon control wafer (e.g., 431 Å per 40 seconds), an almost seven times reduction in removal rate is achieved by using carbon as dopant at a dosage of about $1E15/cm^2$. The reduction of removal rate in response to increased boron dosage is, however, not as drastic as the case with carbon, as illustrated in FIG. 14. While FIG. 14 shows measurements for several combinations of dopant and dosage, other combinations of dopant and dosage are possible. For example, a carbon dopant with a dosage of 1E17/cm² may be used.

Referring back to FIG. 4, after the implantation of the dopant, the top portion of polysilicon layer 108 forms a top layer 110, sometimes also referred to as a treated layer 110 or a doped layer 110. In accordance with some embodiments, a thickness $h_c$ of doped layer 110 is in a range from about 50 Å to about 200 Å, such as 100 Å. Due to the topography of the underlying polysilicon layer 108, doped layer 110 may also exhibit a topography. For example, upper surface 110a of doped layer 110 over upper surface 108a (see FIG. 3) of polysilicon layer 108 is higher (e.g., further away from substrate 102) than upper surface 110c over upper surface 108c (see FIG. 3) of polysilicon layer 108, as illustrated in FIG. 4. Similarly, upper surface 110b of doped layer 110 over upper surface 108b (see FIG. 3) of polysilicon layer 108 may be higher than upper surface 110c over upper surface 108c (see FIG. 3) of polysilicon layer 108. Upper surface 110a may, or may not be, level with upper surface 110b.

Figure 5:
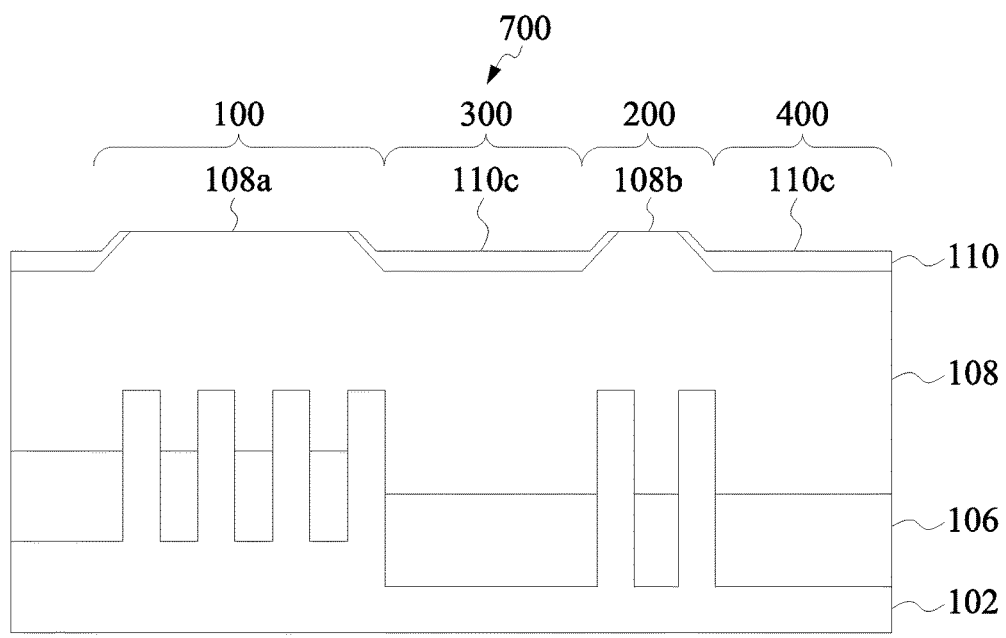

Next, as illustrated in FIG. 5, portions of doped layer 110 in high pattern density regions (e.g., regions 100 and 200) are removed to expose corresponding portions of the underlying polysilicon layer 108. In some embodiments, doped layer 110 is polished by, e.g., a CMP process. Since doped layer 110 is rather thin (e.g., having a thickness of about 50 Å to 200 Å), and since the portions of doped layer 110 in high pattern density regions are higher (e.g., further away from substrate 102) than the portions of doped layer 110 in low pattern density regions, the higher portions of doped layer 110 (e.g., portions corresponding to upper surfaces 110a and 110b in FIG. 4) are removed first by the CMP process. Therefore, upper surfaces 108a/108b of polysilicon layer 108 are exposed while a portion, or all, of the lower portions of doped layer 110 (e.g., portions corresponding to upper surface 110c) remain over polysilicon layer 108, in some embodiments. The removal of the higher portions of doped layer 110 to expose underlying portions of polysilicon layer 108 may be referred to as break-through of doped layer 110 hereinafter. In some embodiments, when the break-through of the higher portions of doped layer 110 happens, the remaining lower portions of doped layer 110 still has a thickness of about 50 Å or less.

Figure 6:
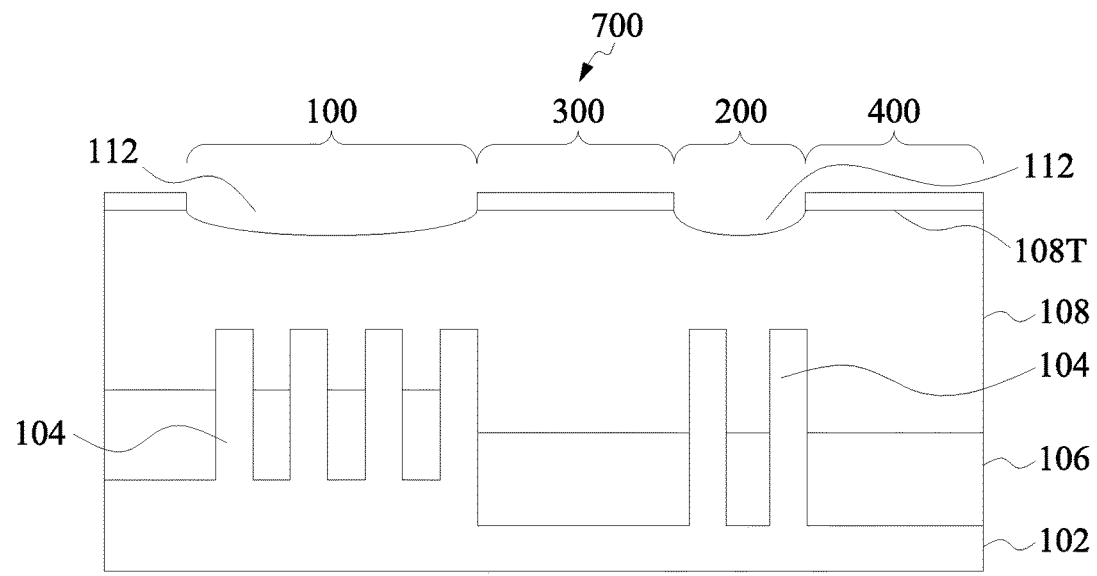

Referring to FIG. 6, the CMP process continues after the break-through of the higher portions of doped layer 110. Exposed portions of polysilicon layer 108 (e.g., in regions 100 and 200) and the lower portions of doped layer 110 (e.g., in regions 300 and 400) are removed by the CMP process. However, the exposed portions of polysilicon layer 108 are removed at a faster removal rate than the lower portions of doped layer 110, due to doped layer 110 having a removal rate slower than that of polysilicon layer 108 (see FIG. 14), in accordance with some embodiments. As illustrated in FIG. 6, recesses 112 are formed in regions 100 and 200 due to the difference in the removal rates of polysilicon layer 108 and doped layer 110. Note that the shapes and depths of recesses 112 are exaggerated in FIG. 6 for illustration purpose.

Since the lower portions of doped layer 110 protect underlying portions of polysilicon layer 108 from the CMP process, polysilicon layer 108 in the low pattern density regions (e.g., regions 300 and 400) are removed at a slower removal rate than polysilicon layer 108 in the high pattern density regions (e.g., regions 100 and 200) in the processing of FIG. 6, thus the overall removal rate (e.g., average removal rate) of polysilicon layer 108 in the low pattern density regions is reduced. Recall that without doped layer 110, polysilicon layer 108 in low pattern density regions would have been removed at a faster removal rate than polysilicon layers 108 in high pattern density regions. Therefore, doped layer 110 reverses the relation of removal rates for high pattern density regions and low pattern density regions, and is sometimes referred to as a reverse layer 110.

Figure 7:
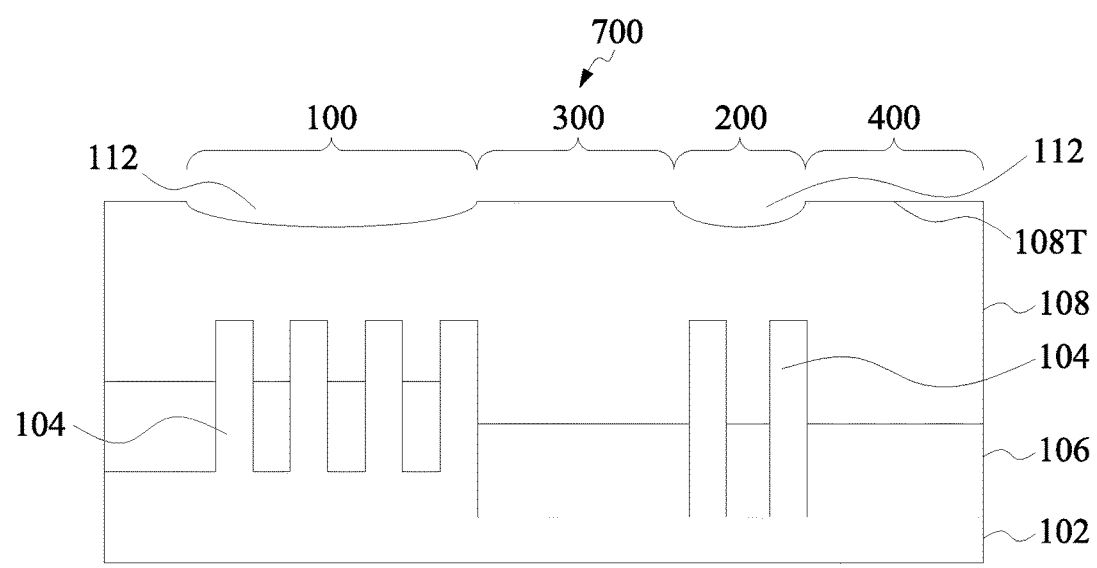

Referring to FIG. 7, as the CMP process continues, the remaining lower portions of doped layer 110 is eventually polished away, and all regions (e.g., regions 100, 200, 300 and 400) of polysilicon layer 108 are exposed. Without the protection of doped layer 110, portions of polysilicon layer 108 in the low pattern density regions (e.g. regions 300 and 400) are now removed at a faster removal rate than portions of polysilicon layer 108 in high pattern density regions (e.g., regions 100 and 200). As a result, the upper surfaces of polysilicon layer 108 in low pattern density regions catch up with the upper surfaces (e.g., bottom surfaces of recesses 112) of polysilicon layer 108 in high pattern density regions, and depths of recesses 112 are reduced. The removal rate of polysilicon layer 108 in the high pattern density regions during the processing stages shown in FIGS. 6 and 7 may, or may not, be the same, depending on various factors such as the specific pattern density, areas of the high pattern density region, thickness of the doped layer 110, and the doping concentration, as examples.

Figure 8:
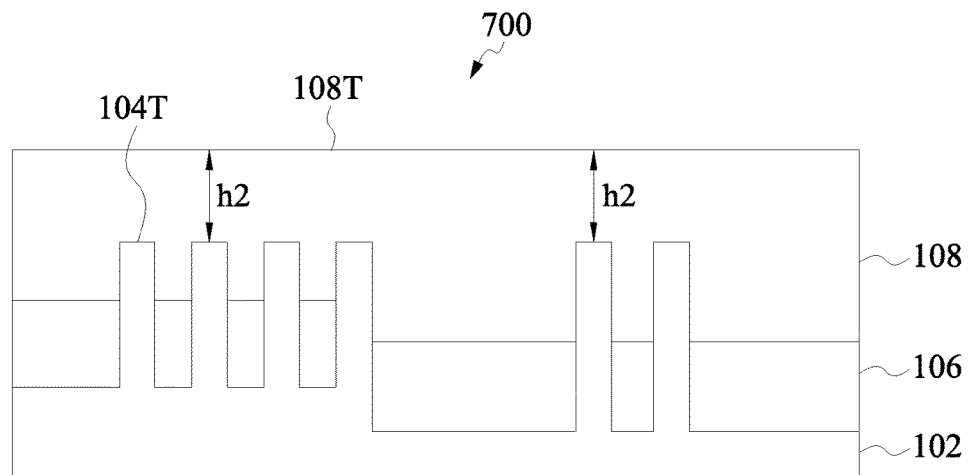

Referring to FIG. 8, as the CMP process proceeds, a planar upper surface 108T is achieved at a certain point, when upper surfaces of polysilicon layers 108 in high pattern density regions are level with upper surfaces of polysilicon layers 108 in low pattern density regions. The CMP process is stopped when a planar upper surface 108T is detected, in some embodiments. Different end-point detection methods may be used to determine when to stop the CMP process. For example, as the upper surface of polysilicon layer 108 approaches the final planar state (e.g., becomes flatter across all regions), more areas of the upper surface of polysilicon layer 108 contact the polishing pad of the CMP tool. The increased contact area between polysilicon layer 108 and the CMP tool causes more friction. To maintain a substantially constant rotation speed (e.g., round-per-minute, or RPM count) of the CMP tool, the torque of the CMP tool needs to be increased to compensate for the increased friction. By monitoring the torque of the CMP tool, the end-point of the CMP process can be detected when the torque reaches a pre-determined value, which pre-determined value may be obtained heuristically from experiments and/or prior data collected during IC fabrication process. As another example, the end-point could be detected by directly measuring the flatness of the wafer using wafer flatness measurement tools.

As illustrated in FIG. 8, a remaining portion of polysilicon layer 108 has a planar upper surface 108T and a thickness $h_2$ from about 600 Å to about 1200 Å, such as 960 Å, where thickness $h_2$ is defined as the distance from top surface 108T of polysilicon layer 108 to a top surface 104T of a fin 104. Thickness $h_2$ of the remaining portion of polysilicon layer 108 is equivalent to gate height $h_2$, when the remaining portion of polysilicon layer 108 is patterned to form polysilicon gate structures, as described below.

Figure 9:
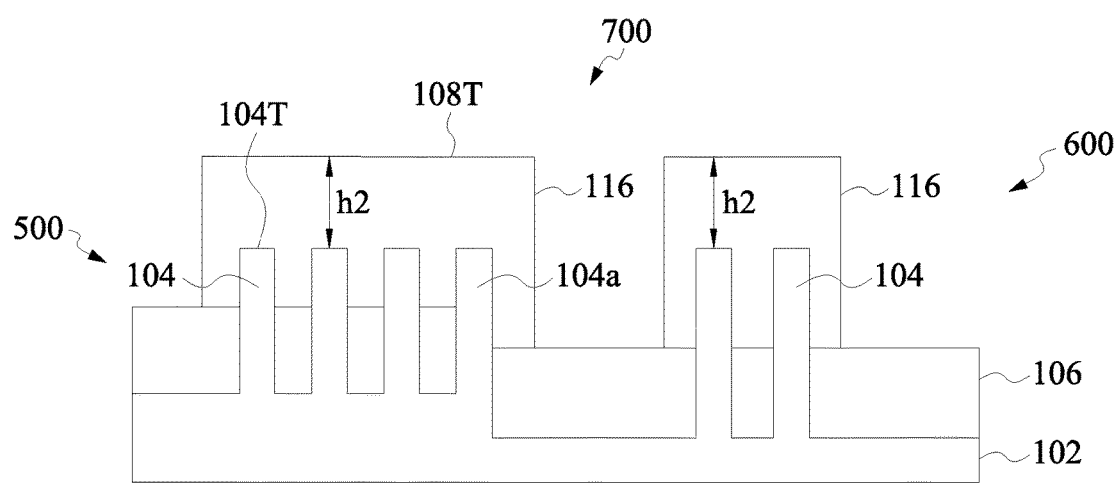

Referring to FIG. 9, polysilicon gate structures 116, sometimes referred to as polysilicon stacks 116, are formed by patterning the remaining portion of polysilicon layer 108 shown in FIG. 8, using lithography and etching process known in the art. Polysilicon stacks 116 are formed such that the longitudinal direction of polysilicon stacks 116 is perpendicular with the longitudinal direction of fins 104, as shown in FIG. 9, in embodiments of the present disclosure.

Although not shown in FIG. 9, polysilicon stack 116 may include a dummy gate dielectric layer. The dummy gate dielectric layer may be blanket deposited on substrate 102, STI layer 106 and fins 104 before polysilicon layer 108 is formed, e.g., after the processing shown in FIG. 2 and before the processing shown in FIG. 3. After polysilicon layer 108 achieves a planar upper surface following processing steps such as those illustrated in FIGS. 3-8, lithography and etching process may be performed to pattern the polysilicon layer 108 and the dummy gate dielectric layer to form polysilicon gate stack 116. In accordance with some embodiments, the dummy gate dielectric layer may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In embodiments of the present disclosure, the dummy gate dielectric layer may be formed using a suitable process such as atomic layer deposition (ALD), CVD, physical vapor deposition (PVD), thermal oxidation, UV-Ozone Oxidation, or combinations thereof. The dummy gate dielectric layer may further comprise an interfacial layer (not shown) to reduce damage between the dummy gate dielectric layer and upper portion of fins 104 (i.e., channel region of the FinFET). The interfacial layer may comprise silicon oxide. In a gate-last process, the dummy gate dielectric layer and polysilicon stack 116 may be removed and replaced in subsequent processing. However, in a gate-first process, the dummy gate dielectric material and polysilicon stack 116 described above are used to form field effect transistors and are not replaced in subsequent processing, in some embodiments. Therefore, the dummy gate dielectric layer described above may also be referred to as a gate dielectric material in a gate-first process.

Polysilicon gate structures 116 may also include a work function layer (not shown) tuned to have a proper work function for enhanced performance of FinFET devices 500 and 600. In some embodiments, polysilicon gate structures 116 comprises a work function layer over a gate dielectric layer, and a polysilicon layer (e.g., polysilicon layer 108) over the work function layer, such that the work function layer is disposed between the polysilicon layer and the gate dielectric layer. The work function layer may include, e.g., Ta, TiAl, TiAlN, TaCN, combination thereof, or multiplayers thereof, for n-type field effect transistors; or TiN, TaN, combination thereof, or multilayers thereof, for p-type field effect transistors.

It should be noted that the number of polysilicon stacks 116 is not limited by that shown in FIG. 9 and can include more or less than that depicted in FIG. 9. In embodiments of the present disclosure, polysilicon stacks 116 may be simultaneously formed, such that each polysilicon stack 116 may comprise the same materials or layers. Since top surfaces 104T of all fins 104 are coplanar, and the remaining portion of polysilicon layer 108 has a planar upper surface 108T, gate heights $h_2$ are the same for FinFET devices 500 and 600 in different regions of semiconductor device 700, regardless of pattern densities.

Figure 10A:
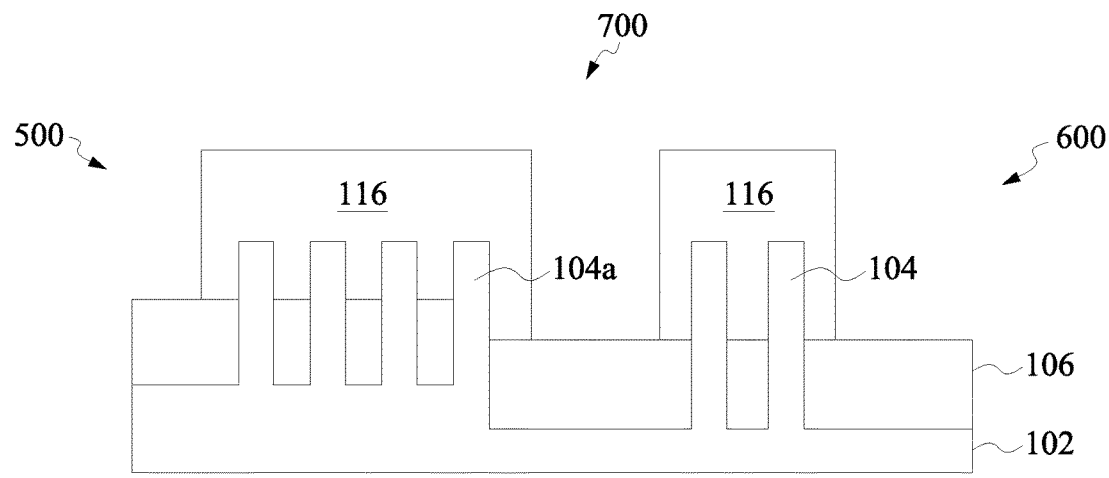
Figure 10B:
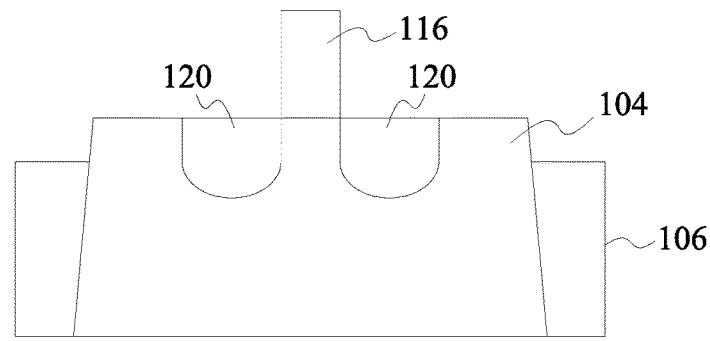

FIGS. 10A and 10B illustrate two cross-sectional views of semiconductor device 700 shown in FIG. 9, after source/drain regions 120 are formed on opposite sides of respective polysilicon stack 116, according to embodiments of the present disclosure. Source/drain regions 120 are not visible in the cross-sectional view of FIG. 10A because they are not in plane A-A (see FIG. 1) but are shown in the cross-sectional view of FIG. 10B along plane B-B (see FIG. 1). In some embodiments, source/drain regions 120 may be epitaxy regions formed within fins 104. In an embodiment of the present disclosure, source/drain regions 120 may be silicon epitaxy regions. In another embodiment, source/drain regions 120 may be silicon germanium epitaxy regions. However, numerous other embodiments of epitaxially grown materials are possible such as, silicon, silicon germanium, silicon carbide, germanium, gallium arsenide, indium phosphide, and/or other suitable materials.

In accordance with some embodiments of the present disclosure, gate spacers (not shown) are formed over sidewalls of polysilicon stacks 116 to define source/drain regions 120 on fins 104. The gate spacers are typically formed by blanket depositing a spacer layer (not shown) on the previously formed semiconductor structure 700. In an embodiment, the gate spacers may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD, sputter, and other methods known in the art. The gate spacers are then patterned, for example, by anisotropically etching to remove the spacer layer from the horizontal surfaces of semiconductor structure 700.

After gate spacers are formed, source/drain regions 120 are formed in fins 104. In some embodiments, source/drain regions 120 may be doped by performing an implanting process to implant appropriate dopants to complement the dopants in fin 104. In other embodiments, an epitaxy (epi) process is performed to form source/drain regions 120 within fins 104. The source/drain regions 120 may be implemented by performing an etching process to form recess regions in fins 104 and then performing an epitaxy (epi) process to deposit a semiconductor material in the recess regions. The etching process may be a plasma dry etching processing. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the substrate. The semiconductor material may include Si, SiP, SiC, SiCP, a combination thereof, or any other suitable semiconductor material.

Figure 11:
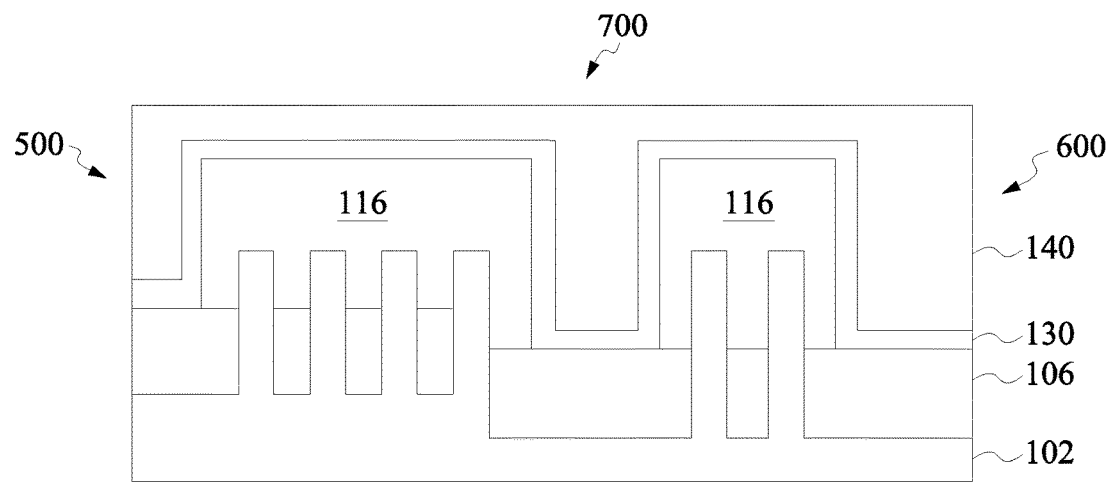

Following the processing illustrated in FIGS. 10A and 10B, an etch stop layer (ESL) 130 and an inter-layer dielectric (ILD) layer 140 are formed over the gate spacers (not shown), the polysilicon stacks 116, source/drain regions 120, fins 104 and isolation structures 106, as illustrated in FIG. 11. ESL 130 may be conformally deposited over semiconductor device 700. In an embodiment, ESL 130 comprises SiN, SiCN, SiON, the like, or a combination thereof and may be formed by ALD, molecular layer deposition (MLD), a furnace process, CVD, plasma enhanced CVD (PECVD), the like, or a combination thereof.

After ESL 130 is formed, ILD 140 may be deposited over ESL 130 and fills the space between polysilicon stacks 116. In some embodiments, ILD 140 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. ILD 140 may be formed by CVD, ALD, PECVD, subatmospheric CVD (SACVD), flowable CVD, a high density plasma (HDP), a spin-on-dielectric process, the like, or a combination thereof.

Figure 12:
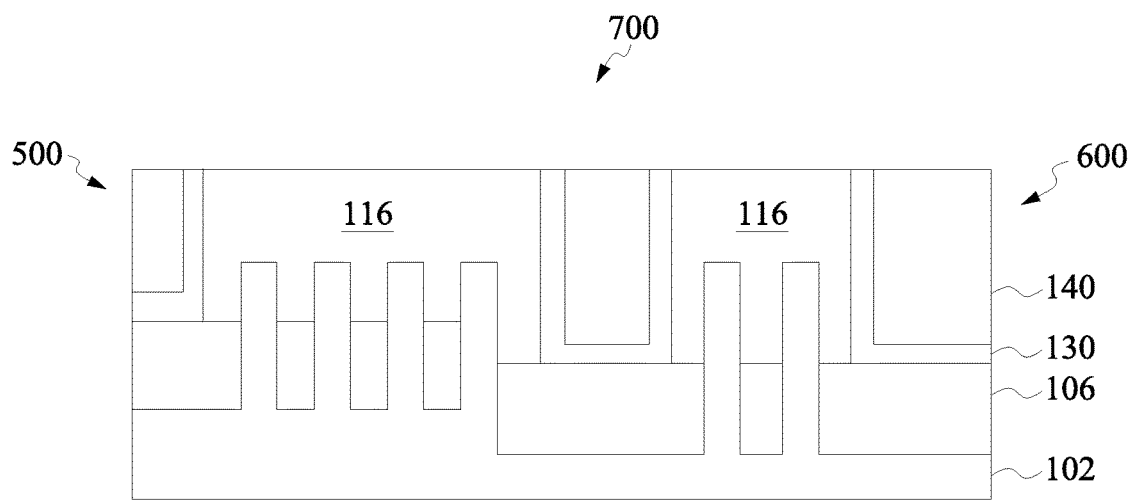

FIG. 12 illustrates a cross-sectional view of semiconductor device 700 shown in FIG. 11, after a planarization process is performed to remove portions of ILD 140 and ESL 130 to expose a top surface of each polysilicon stack 116. The planarization process may be performed by a CMP process. Alternatively, any other suitable planarization techniques known in the art may be used.

Figure 13:
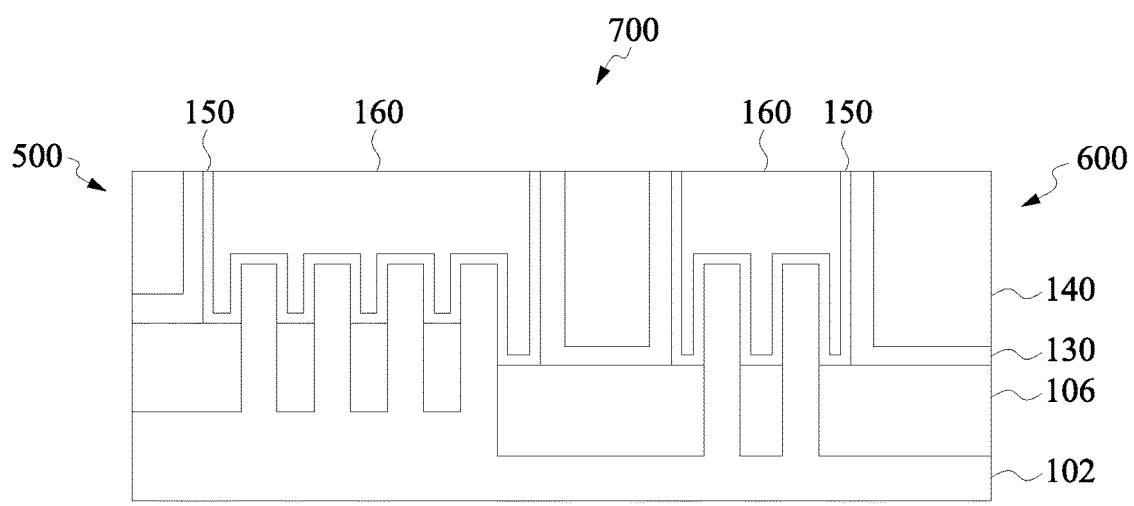

FIG. 13 illustrates a cross-sectional view of semiconductor device 700 shown in FIG. 12, after a gate-last process is performed. During the gate-last process, polysilicon stacks 116 shown in FIG. 12 may be replacement polysilicon gates (RPG) and may be replaced by metal gate stacks 160 in FIG. 13. In the gate-last process, polysilicon stacks 116 are removed to form trenches for forming gate stacks. Gate dielectric layer 150 is deposited on sidewalls of the trenches, and gate electrode layer 160 is deposited over the gate dielectric layer 150 to fill the trenches. The ILD layer 140, gate dielectric layer 150 and gate electrode layer 160 are then polished, in some embodiments.

In accordance with some embodiments, gate dielectric material 150 may include silicon oxide, silicon nitride, silicon oxy-nitride, or high-k dielectrics. Examples of gate dielectric material 150 and the formation methods of gate dielectric material 150 are similar to those of the dummy gate dielectric material discussed above, thus not repeated here.

In embodiments of the present disclosure, the gate electrode layer may comprise a single-layer or multilayer structure. In embodiments, the gate electrode layer comprises poly-silicon. Further, the gate electrode layer may be doped polysilicon with the uniform or non-uniform doping. In other embodiments, the gate electrode layer comprises a metal selected from a group of W, Cu, Ti, Ag, Al, TiAl, TiAlN, TaC, TaCN, TaSiN, Mn, and Zr. In other embodiments, the gate electrode layer comprises a metal selected from a group of TiN, WN, TaN, and Ru. The gate electrode layer may be formed by a suitable process such as ALD, CVD, PVD, plating, or combinations thereof.

FIGS. 2-13 are examples used to illustrate various embodiments of the present disclosure. Further IC manufacturing processes are needed to form various features of an IC chip known in the art. Exemplary processes that may be performed include the formation of contact features coupled to the gate structure, and a multi-layer interconnect (MLI) having vias and interconnect lines that may interconnect one or more semiconductor devices formed on the substrate.

It should be noted that FIGS. 2-13 use a gate-last process as an example. In embodiments of the present disclosure, a gate-first process may be performed such that gate stacks 116 (see FIG. 9) are used to form the FinFET. In this case, gate stack 116 includes a gate dielectric layer (described above as the dummy gate dielectric layer), and the gate electrode may comprise materials such as polysilicon, Ta, TiAl, TiAlN, TaCN, TiN, TaN, combinations thereof, and multi-layers thereof. Although the present disclosure uses a FinFET device as an example, one skilled in the art will appreciate that the method illustrated in FIGS. 2-8 for obtaining equal gate heights $h_2$ across different regions of IC device, regardless of pattern densities, is applicable to planar devices as well. In addition, the method illustrated in FIGS. 2-8 for obtaining a planar upper surface after a CMP process could also be applied to a dielectric layer, although different dopant with different doping concentration may be used for the dielectric layer.

The present disclosure has many advantages. By providing a planar upper surface for polysilicon layer 108 after the CMP process, equal gate heights can be achieved across all regions of the IC chip regardless of pattern densities. Equal gate heights are beneficial for IC chip performance, by making it easier to provide uniform RC delay and uniform accessing speed across all gates. During IC manufacturing process, multiple layers may be formed on top of polysilicon layer 108, which multiple layers may need to have uniform thickness and planar surface. A polysilicon layer 108 with a planar upper surface provides a flat base for forming other layers on top of it, which enables further processing such as CMP to achieve the desired uniform thickness and planar surface for the other layers. Lithography techniques are frequently used in IC manufacturing. Planar surfaces for layers above polysilicon layer 108, enabled by the current disclosure, are crucial for achieving desired accuracy in lithography. In a gate-last process, the sacrificial polysilicon stacks are removed and replaced by metal gate stacks. Equal polysilicon gate heights help to ensure the success of the gate replacement procedure. For example, when a planarization process is used to remove ESL and expose a top surface of the sacrificial polysilicon stacks, un-equal polysilicon gate heights may cause the planarization process to stop after removing ESL of a higher polysilicon stack and leaving residues of ESL on top of a lower polysilicon stack. The residual ESL may cause failure of the gate replacement procedure for the lower polysilicon stack. In contrast, an equal gate height will ensure that ESL on top of all the sacrificial polysilicon stacks are sufficiently removed, so the subsequent polysilicon stacks removal and replacement procedure can finish properly.

Figure 15:
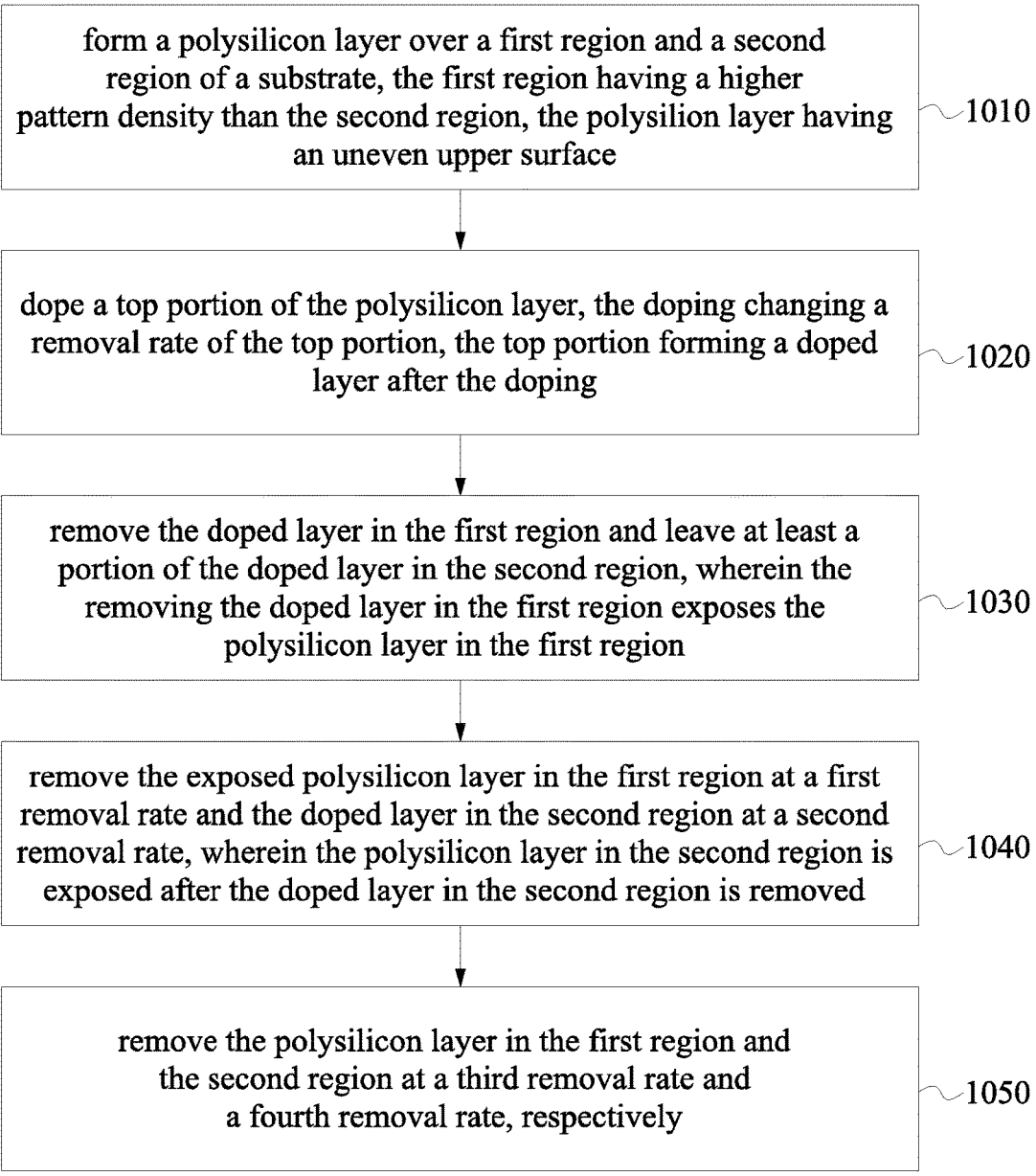
FIG. 15 illustrates a flowchart for a method of fabricating a semiconductor device according to various embodiments of the present disclosure.

FIG. 15 illustrates a flow chart of a method of fabricating a semiconductor structure in accordance with some embodiments. It should be understood that the embodiment methods shown in FIG. 15 is an example of many possible embodiment methods. One of ordinary skill in the art would recognize many variations, alternatives, and modifications. For example, various steps as illustrated in FIG. 15 may be added, removed, replaced, rearranged and repeated.

Referring to FIG. 15, at step 1010, a polysilicon layer is formed over a substrate and in a first and a second regions of an integrated circuit (IC), as illustrated in FIG. 3. The first region has a higher pattern density than the second region, and the polysilicon layer has an uneven upper surface. At step 1020, a top portion of the polysilicon layer is doped, as illustrated in FIG. 4. The doping changes the removal rate of the top portion. The top portion forms a doped layer after the doping. At step 1030, the doped layer in the first region is removed, and at least a portion of the doped layer in the second region is left, as illustrated in FIG. 5. Removing the doped layer in the first region exposes the polysilicon layer in the first region. At step 1040, the polysilicon layer in the first region is removed at a first removal rate and the doped layer in the second region is removed at a second removal rate, as illustrated in FIG. 6. The polysilicon layer in the second region is exposed after the doped layer in the second region is removed. At step 1050, the polysilicon layer in the first region is removed at a third removal rate, and the polysilicon layer in the second region is removed at a fourth removal rate, as illustrated in FIG. 7.

In accordance with an embodiment, a method of manufacturing a semiconductor device includes forming a polysilicon layer over a first region and a second region of a substrate, the first region having a higher pattern density than the second region, the polysilicon layer having an uneven upper surface. The method also includes doping a top portion of the polysilicon layer, the doping changing the removal rate of the top portion, the top portion forming a doped layer after the doping. The method further includes removing the doped layer in the first region and leaving at least a portion of the doped layer in the second region. The removing the doped layer in the first region exposes the polysilicon layer in the first region. The method further includes removing the exposed polysilicon layer in the first region at a first removal rate and the doped layer in the second region at a second removal rate. The polysilicon layer in the second region is exposed after the doped layer in the second region is removed. The method further includes removing the polysilicon layer in the first region and the second region at a third removal rate and a fourth removal rate, respectively.

In another embodiment, a method of forming a Fin Field-Effect Transistor (FinFET) includes forming a first fin and a second fin in a first region and a second region of a substrate, respectively, forming isolation structures on opposing sides of each of the first and the second fins, and depositing a polysilicon layer over the substrate, the first and second fins, and the isolation structures, the polysilicon layer having an uneven upper surface. The method also includes treating a top portion of the polysilicon layer to form a reverse layer, the reverse layer having a removal rate slower than that of the polysilicon layer, and performing a planarization process. The planarization process includes removing a first region of the reverse layer to expose a first portion of the polysilicon layer while leaving a second region of the reverse layer covering a second portion of the polysilicon layer, removing the second region of the reverse layer at a first removal rate, and the exposed first portion of the polysilicon layer at a second removal rate, and after the second region of the reverse layer is removed and the second portion of the polysilicon layer is exposed, removing the first and the second portions of the polysilicon layer at a third removal rate and a fourth removal rate, respectively.

In yet another embodiment, a method of forming a semiconductor device includes providing a substrate with a first pattern density in a first region of the substrate and a second pattern density in a second region of the substrate, the second pattern density being different from the first pattern density, forming a polysilicon layer over the substrate, the polysilicon layer having an uneven upper surface, and implanting carbon in a top portion of the polysilicon layer to reduce the removal rate of the top portion, thereby forming a doped layer. The method also includes performing a planarization process. The planarization process includes breaking-through a first portion of the doped layer to expose a first portion of the polysilicon layer and leaving a second portion of the polysilicon layer covered by a second portion of the doped layer, removing the first portion of the polysilicon layer at a first removal rate, and the second portion of the doped layer at a second removal rate smaller than the first removal rate, until the second portion of the polysilicon layer is exposed, and removing the first portion of the polysilicon layer at a third removal rate, and the second portion of the polysilicon layer at a fourth removal rate larger than the third removal rate. The method further includes stopping the planarization process once the first and the second portions of the polysilicon layer have a coplanar upper surface.

In an embodiment, a method of forming a Fin Field-Effect Transistor (FinFET) device includes: forming a first fin and a second fin in a first region over a substrate and a second region over the substrate, respectively; depositing a polysilicon layer over the first fin, the second fin, and the substrate, the polysilicon layer having an uneven upper surface; treating a top portion of the polysilicon layer to form a reverse layer, the reverse layer having a removal rate slower than that of the polysilicon layer; and performing a planarization process that includes: removing a first region of the reverse layer to expose a first portion of the polysilicon layer while leaving a second region of the reverse layer covering a second portion of the polysilicon layer; removing the second region of the reverse layer at a first removal rate and the exposed first portion of the polysilicon layer at a second removal rate; and after the second region of the reverse layer is removed and the second portion of the polysilicon layer is exposed, removing the first portion of the polysilicon layer and the second portion of the polysilicon layer at a third removal rate and a fourth removal rate, respectively.

In an embodiment, a method of forming a Fin Field-Effect Transistor (FinFET) device includes: forming a polysilicon layer over a first fin and over a second fin, the first fin and the second fin protruding over a substrate, the polysilicon layer extending over upper surfaces of the first fin and the second fin; converting a top layer of the polysilicon layer into a doped polysilicon layer using a doping process; performing an etching process, the etching process removing a first portion of the doped polysilicon layer to expose a first portion of the polysilicon layer while leaving a second portion of the doped polysilicon layer over a second portion of the polysilicon layer; removing the second portion of the doped polysilicon layer and the exposed first portion of the polysilicon layer at a first removal rate and a second removal rate, respectively; and after the second portion of the doped polysilicon layer is removed, removing the first portion of the polysilicon layer and the second portion of the polysilicon layer at a third removal rate and a fourth removal rate, respectively, until an upper surface of the first portion of the polysilicon layer is level with an upper surface of the second portion of the polysilicon layer.

In an embodiment, a method of forming a Fin Field-Effect Transistor (FinFET) device includes: forming a semiconductor layer over a substrate, the substrate having a first fin in a first region of the substrate and having a second fin in a second region of the substrate, the first region having a first pattern density, the second region having a second pattern density different from the first pattern density, the semiconductor layer having an uneven upper surface; implanting carbon or boron in a top portion of the semiconductor layer to convert the top portion of the semiconductor layer into a doped layer; and performing a planarization process that includes: breaking-through a first portion of the doped layer to expose a first portion of the semiconductor layer and leaving a second portion of the semiconductor layer covered by a second portion of the doped layer; removing the first portion of the semiconductor layer at a first removal rate, and removing the second portion of the doped layer at a second removal rate smaller than the first removal rate, until the second portion of the semiconductor layer is exposed; and removing the first portion of the semiconductor layer at a third removal rate, and removing the second portion of the semiconductor layer at a fourth removal rate larger than the third removal rate. The method further includes stopping the planarization process upon detection that the first portion of the semiconductor layer and the second portion of the semiconductor layer have a coplanar upper surface.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a Fin Field-Effect Transistor (FinFET) device, the method comprising:
    forming a first fin and a second fin in a first region over a substrate and a second region over the substrate, respectively;
    depositing a polysilicon layer over the first fin, the second fin, and the substrate, the polysilicon layer having an uneven upper surface;
    treating a top portion of the polysilicon layer to form a reverse layer, the reverse layer having a removal rate slower than that of the polysilicon layer; and
    performing a planarization process, comprising:
        removing a first region of the reverse layer to expose a first portion of the polysilicon layer while leaving a second region of the reverse layer covering a second portion of the polysilicon layer;
        removing the second region of the reverse layer at a first removal rate and the exposed first portion of the polysilicon layer at a second removal rate; and
        after the second region of the reverse layer is removed and the second portion of the polysilicon layer is exposed, removing the first portion of the polysilicon layer and the second portion of the polysilicon layer at a third removal rate and a fourth removal rate, respectively.

2. The method of claim 1, further comprising forming isolation structures on opposing sides of the first fin and opposing sides of the second fin, wherein a top surface of the first fin is formed to be level with a top surface of the second fin, and wherein a first top surface of the isolation structures in the first region extends further from the substrate than a second top surface of the isolation structures in the second region.

3. The method of claim 1, wherein the first removal rate is smaller than the second removal rate.

4. The method of claim 1, wherein the third removal rate is smaller than the fourth removal rate.

5. The method of claim 1, further comprising stopping the planarization process upon detecting that the first portion of the polysilicon layer and the second portion of the polysilicon layer have a coplanar upper surface.

6. The method of claim 1, wherein the reverses layer is formed to have a thickness between about 50 angstroms and about 200 angstroms.

7. The method of claim 1, wherein treating the top portion of the polysilicon layer comprises doping the top portion of the polysilicon layer with carbon.

8. The method of claim 7, wherein a dosage of the carbon is between about $1E14/cm^2$ and about $1E17/cm^2$.

9. The method of claim 8, wherein the doping uses an implantation process with a doping energy of about 1 Kev.

10. The method of claim 1, wherein treating the top portion of the polysilicon layer comprises doping the top portion of the polysilicon layer with boron.

11. The method of claim 10, wherein a dosage of the boron is between about $1E14/cm^2$ and about $1E15/cm^2$.

12. The method of claim 11, wherein the doping uses an implantation process with a doping energy between about 0.5 Kev to about 100 Kev.

13. The method of claim 1, wherein the planarization process uses a chemical mechanical planarization (CMP) process.

14. A method of forming a Fin Field-Effect Transistor (FinFET) device, the method comprising:
    forming a polysilicon layer over a first fin and over a second fin, the first fin and the second fin protruding over a substrate, the polysilicon layer extending over upper surfaces of the first fin and the second fin;
    converting a top layer of the polysilicon layer into a doped polysilicon layer using a doping process;
    performing an etching process, the etching process removing a first portion of the doped polysilicon layer to expose a first portion of the polysilicon layer while leaving a second portion of the doped polysilicon layer over a second portion of the polysilicon layer;
    removing the second portion of the doped polysilicon layer and the exposed first portion of the polysilicon layer at a first removal rate and a second removal rate, respectively; and
    after the second portion of the doped polysilicon layer is removed, removing the first portion of the polysilicon layer and the second portion of the polysilicon layer at a third removal rate and a fourth removal rate, respectively, until an upper surface of the first portion of the polysilicon layer is level with an upper surface of the second portion of the polysilicon layer.

15. The method of claim 14, wherein the doping process uses a dopant that comprises carbon or boron.

16. The method of claim 14, wherein the first removal rate is smaller than the second removal rate, and the third removal rate is smaller than the fourth removal rate.

17. The method of claim 14, further comprising, after the stopping, forming one or more polysilicon gate stacks over the first fin and over the second fin.

18. The method of claim 17, further comprising replacing the one or more polysilicon gate stacks with metal gates.

19. A method of forming a Fin Field-Effect Transistor (FinFET) device, the method comprising:
    forming a semiconductor layer over a substrate, the substrate having a first fin in a first region of the substrate and having a second fin in a second region of the substrate, the first region having a first pattern density, the second region having a second pattern density different from the first pattern density, the semiconductor layer having an uneven upper surface;
    implanting carbon or boron in a top portion of the semiconductor layer to convert the top portion of the semiconductor layer into a doped layer;
    performing a planarization process, comprising:
        breaking-through a first portion of the doped layer to expose a first portion of the semiconductor layer and leaving a second portion of the semiconductor layer covered by a second portion of the doped layer;
        removing the first portion of the semiconductor layer at a first removal rate, and removing the second portion of the doped layer at a second removal rate smaller than the first removal rate, until the second portion of the semiconductor layer is exposed; and
        removing the first portion of the semiconductor layer at a third removal rate, and removing the second portion of the semiconductor layer at a fourth removal rate larger than the third removal rate; and stopping the planarization process upon detection that the first portion of the semiconductor layer and the second portion of the semiconductor layer have a coplanar upper surface.

20. The method of claim 19, further comprising, after stopping the planarization process, forming a first gate stack over the first fin and forming a second gate stack over the second fin, the first gate stack having a same gate height with the second gate stack.

* * * * *